United States Patent
Gunther et al.

[11] Patent Number: 5,853,296
[45] Date of Patent: Dec. 29, 1998

[54] COMPONENT FOR ELECTRONIC ENCLOSURE

[75] Inventors: Hans-Ulrich Gunther, Pfinztal; Michael Joist, Gaggenau; Klaus Pfeifer, Karlsruhe, all of Germany

[73] Assignee: Schroff GmbH, Straubenhard, Germany

[21] Appl. No.: 757,665

[22] Filed: Nov. 29, 1996

[51] Int. Cl.⁶ .................................................. H01R 4/66
[52] U.S. Cl. ............................................. 439/92; 439/609
[58] Field of Search ........................... 439/92, 607, 629; 174/35 C, 35 GC

[56] References Cited

U.S. PATENT DOCUMENTS

| | | | |
|---|---|---|---|
| 4,600,256 | 7/1986 | Anttila | 439/609 X |
| 5,004,866 | 4/1991 | Cooke et al. | 174/35 GC |
| 5,118,307 | 6/1992 | Knoop et al. | |
| 5,233,507 | 8/1993 | Gunther et al. | 439/609 X |
| 5,307,242 | 4/1994 | Seibold et al. | 439/609 X |

FOREIGN PATENT DOCUMENTS

WO 93/20676 A1 10/1993 WIPO.

*Primary Examiner*—Paula Bradley
*Assistant Examiner*—Daniel Wittels
*Attorney, Agent, or Firm*—Merchant, Gould, Smith, Edell, Welter & Schmidt

[57] ABSTRACT

For the purpose of high frequency effective insulation for gaps in the enclosure of electronic devices, a plate 1 is proposed that shows a groove 9 on at least one of its narrow sides 7, 8. In this groove 9 is a spring element 2 with its attached leaf clip 12. Attached on the leaf clip 12 is a right-angled leaf spring 13, with a base piece 21 and a contact piece 22. The contact piece 22 is bent back on itself and bears a contact fin 29, which makes contact with the corresponding contact piece of a neighboring prefabricated component.

13 Claims, 4 Drawing Sheets

COMPONENT FOR ELECTRONIC ENCLOSURE

BACKGROUND OF THE INVENTION

The discovery has to do with a prefabricated component for electronic enclosures with a metal plate and at least one electrical contact-producing spring element, which is arranged in the area around the edge of the plate.

The discovery finds application especially through the endeavor to sound proof high frequencies from electronic devices in closed components, with express regard to the shielding effect where electromagnetic inflow is necessary, or those building elements that cause electromagnetic disturbances that are not allowed to reach the external environment. The most difficult leakage points to control are therefore the long vertical slots between the front plate of two neighboring linked components, a front plate and the casing frame respectively. Therefor at these critical points a contact device is inserted that should effect a electrical contact on the opposing plate edges (DE-GM 88 03 544, US-PS 4631 641, DE-OS 36 04 860, DE-OS 35 23 770, DE-AS 22 47 005).

It is known to depict front plates of components in u-shaped cross-sections, whereby on the one side a longitudinal plate reaches back to the circuit board and on the opposite side a longitudinal tab with an inserted sloping surface appears. Spring elements are stuck on the longitudinal plate, that in connected components lie along the longitudinal rail of the front plate. An excellent shielding effect is attained thereby, however with the inner extension and the spring elements inadvertent longitudinal tab, an open space is required, which is not available especially with normal interlocking components and out of constructive reasons. Between the longitudinal tab with its spring element and the circuit board, the circuit board cover, solder projections, and the front plug connectors, there exists a constant danger of collisions that can be the cause of short circuits (DE-PS 41 10 800). A reduction of the longitudinal tabs height to eliminate this disadvantage would reduce the necessary spring stroke and lead to a worsening of the shielding effect or the longevity of the shield position.

The task of the discovery is based on the desire for a very effective, stable, high-frequency moderating insulation for the cracks, remaining out of technical reasons, between individual prefabricated components from the enclosures of electronic devices in which the insulating element requires only very narrow space on the inside of the casing.

The solution to the proposed task will be started and solved by a prefabricated component for electronic enclosures, with a plate on whose border contact-giving spring elements are designed, through the following constructive measures: the plate shows a groove in at least one of its narrow sides a groove, the groove extends itself parallel to the edge of the narrow side, the spring element shows a leaf clip and a leaf spring, the leaf clip and the leaf spring lie at right angles to one another, the leaf clip lies clipped into the groove, the leaf spring possesses a level base piece and at least one contact piece bent back on itself, the base piece stands parallel to the narrow side, and the contact piece projects out over the plate.

The fastening of the spring element, in a groove created for this purpose on the narrow side of the plate, suggested here is the prerequisite for the arrangement of the springs and contact producing parts close behind the plate with very little room. A necessary creation for a sufficient spring stroke is that the contact piece is bent back on itself so that enough distance remains between the circuit board and the other prefabricated components to avoid collisions.

The groove on the plate shows an effective oblong section. Such a section allows it to be easily made through mills or saws.

The cross sectional u-shaped leaf clip is depicted advantageously. With its u-back sticking out it allows itself to be easily bent and pushed into the groove where sticks due to a spring action.

In order for the leaf clip to lock into the groove of the plate, and to protect against unintentional push or pull outs, it bears at least one spring claw.

The spring claw can be a bent, triangular corner of the leaf clip, which claws into the side wall of the groove under spring pressure.

The base pieces of the leaf springs of several spring elements stand advantageously connected together and thereby create a level continuous spring band. This simplifies the production out of band-shaped material cuttings and punch and bending processes following after one another, whereby the very small longitudinal gaps between the individual spring elements prevents the occurrence of the hacking of the leaf clip and leaf spring under one another. Easy fitting segments of desired length can be easily divided from the unending spring band.

In order to prevent the base piece of the leaf spring from being stuck perhaps too far into the groove of the plate, there is at least one impact tab extending, which lies at the level of the base piece.

To be effective the contact piece is of the type that is bent back on itself, such that it depicts a closer to oval cross-sectional channel. This overall rounded form of the spring portion of the leaf spring lessens the movement of prefabricated components that have attained contact with one another.

The contact piece of the leaf spring can be given a bias when it carries a support tab on its free end that meshes with one of the designed transverse openings in the base piece.

In order to avoid having the support tab slide out of the transverse opening by strong bending of the leaf clips, on the neighboring base piece's longitudinal side of the transverse opening which the holding tab lies sprung up against, an impact splicing plate can appear attached to the base piece.

It is advantageous when the prefabricated component forms at least one contact fin as an installation of a neighboring prefabricated component. Thereby the specific contact pressure on the contact spot will be increased, which can reduce electrical in between resistance. The safety of the contact producer will be increased when the contact piece consists of two contact leaves.

A plate equipped with a groove along both of its longitudinal sides and a spring element can advantageously form the front plate of a prefabricated component for an electronic enclosure of a designed connective component, which stands at the same level of insertion next to like-formed neighboring connective components, whereby the spring elements at that time stand across from one another and are pressed and sprung up against one another making contact.

BRIEF DESCRIPTION OF THE DRAWINGS

The discovery will be more closely explained from e enclosed four drawings. Thereby showing.

DETAILED DESCRIPTION OF THE PREFERRED EMBODIMENT(S)

Figure 1:
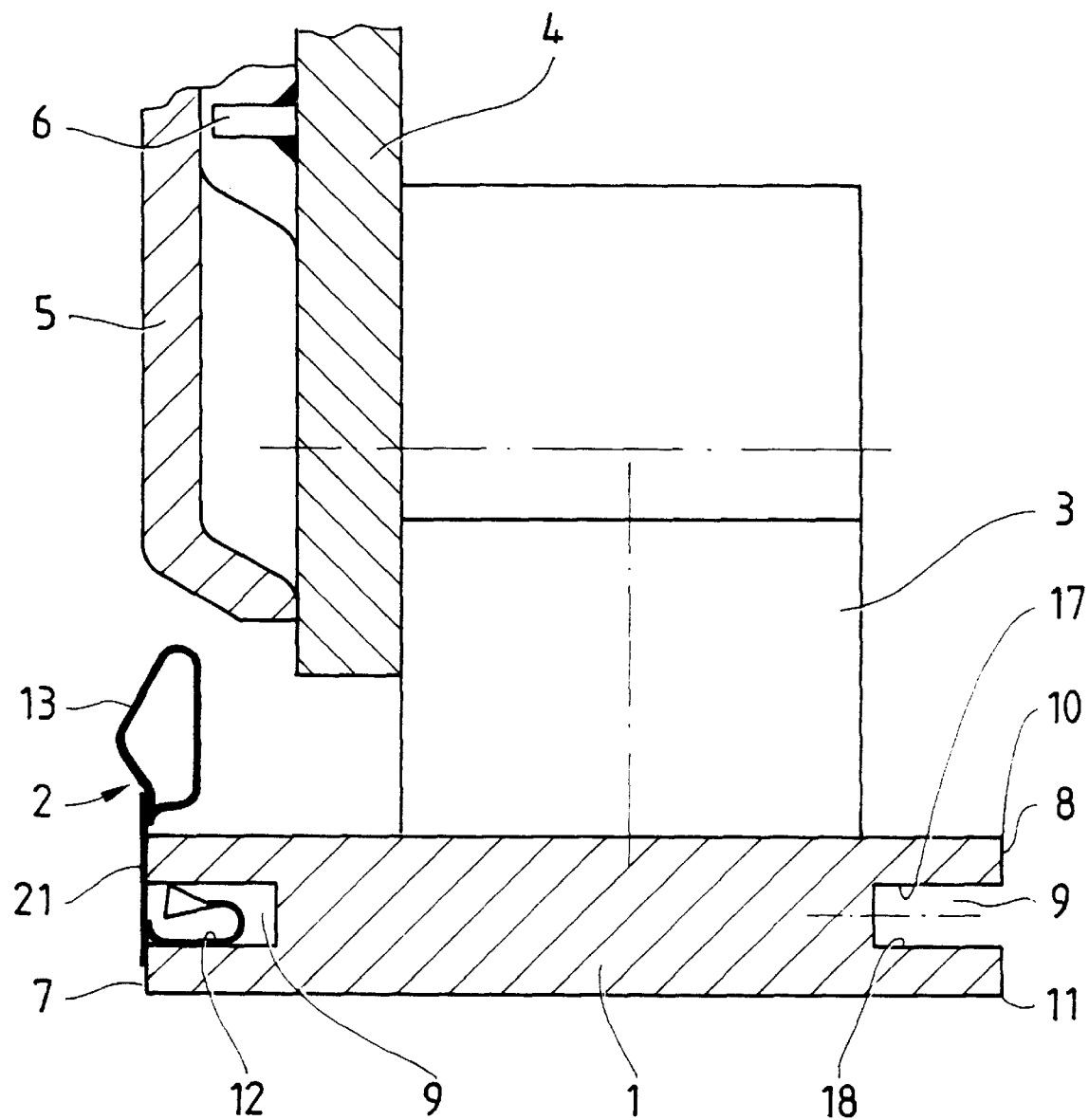
FIG. 1 a prefabricated component with a plate with a spring element, used as the front plate of a connective component in a section, several times enlarged partial portrayal FIG. 2 two neighboring plates at the same level each with a spring element whose contact pieces are pressed against one another making contact, in section and portrayed likewise enlarged FIG. 3 a spring element in a side view, shown much enlarged FIG. 4 a spring element in a perspective portrayal, seen from behind and above FIG. 5 the spring element according to FIG. 4, a perspective similarly seen from behind, also viewed from below FIG. 6 the spring element according to FIGS. 4 and 5 in a front view

The prefabricated component for electronic enclosures portrayed in FIG. 1 shows a metal plate 1 and a spring element 2. This prefabricated component deals with an industry standard connective component consisting of one that serves as a front plate, plate 1, a support block 3, a circuit board for the reception of electronic prefab elements, as well as a circuit board cover 5. A soldered leg 6 of a prefabricated component (not shown) connects onto the circuit board. The holding block 3 connects the plate I with the circuit board 4.

Plate 1 out of aluminum metal, with a typical sheet metal thickness from 2.5 millimeters, shows on two of its narrow sides 7 and 8 a deep groove 9 with a rectangular transverse segment. This groove 9 is milled, sawed, eroded, or made through the use of a laser beam into the narrow sides of 7, 8. It can also be made through the attachment (screwing, welding) of two similarly sized pieces of plate on one another, of which one bears an according edge cut-out grooved section. The groove 9 extends itself symmetrical and parallel to the edges 10 and 11 of the respective narrow sides 7 or 8, its width corresponds to little more than a third of the plate 1.

The electric contact producing spring 2 consists of a thin, only 0.05 millimeter strong, stainless spring band of steel or a copper-beryllium metal and is made in one piece through pressing and bending.

The spring element 2 is located in the area around the edge of plate 1 and attached to groove 9. This spring element 2 shows (compare to FIG. 3) a leaf clip 12 and a leaf spring 13, both standing at right angles to one another.

Figure 2:
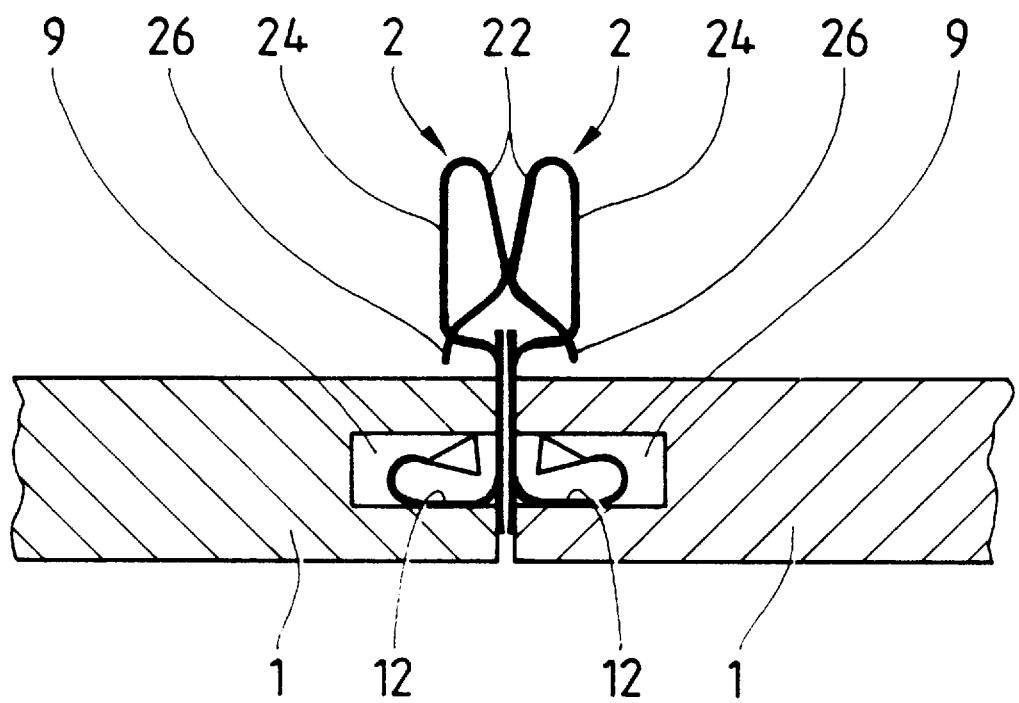

The leaf clip 12 is depicted in a u-shaped cross-section and sticks its u-base 14 out into the groove 9 (see FIGS. 1 and 2). Thereby both u-side angles 15 and 16 are put on and sprung against the side walls 17 and 18 of groove 9. Two spring claws 19 in the form of bent triangular shaped corners 20 on the free end side of the leaf clip 12 bore into the side walls 17 and 18 with their tips and thereby give the spring element 2 a strong hold in the groove 9.

The leaf clip 12 of spring element 2 can also be depicted as a cross-sectional wave-shaped mounting, but it can also be level and fastened through distortion of the groove 9 (that means through their pressing together).

The spring clip 13 consists of a base piece 21 and a contact piece 22. The base piece 21 is (see FIG. 3) depicted level and stands, with leaf clip 12 inserted in the groove 9, parallel to the narrow side 7 or 8 of plate1 (FIG. 1). On base piece 21 two shaped impact splicing plates stand out which are flush with the level of base piece 21. When the leaf clip 12 is pushed in they lie tightly on the narrow side 7 or 8 of the plate1. The base piece 21 of leaf springs 13 stands connected to one another which produces a level, long spring band, consisting of a large number of spring elements 2.

Figure 3:
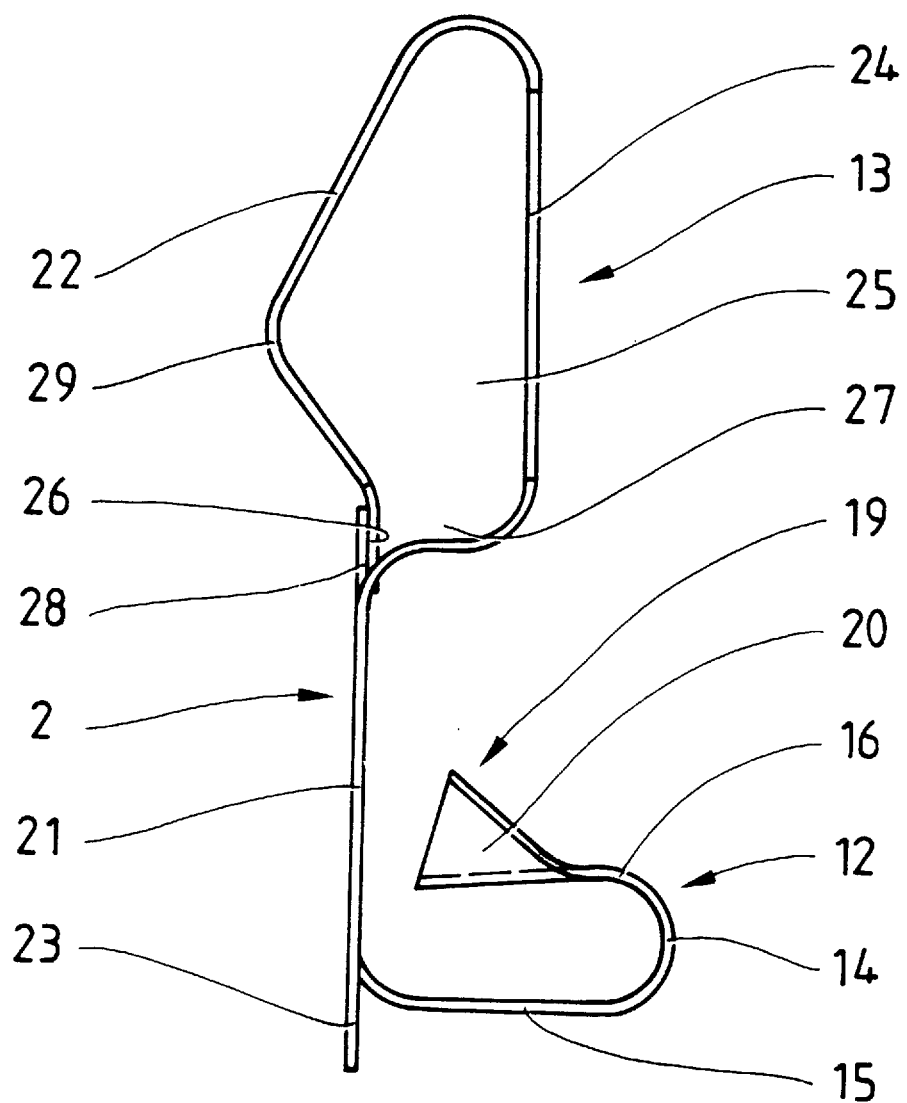
Figure 4:
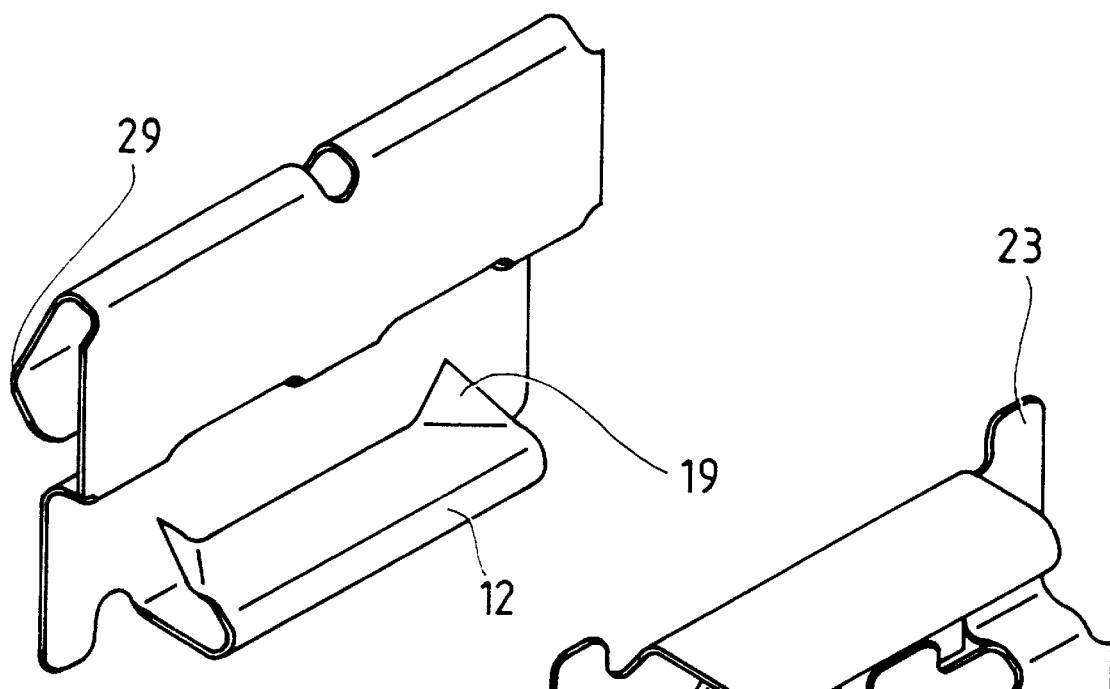
Figure 5:
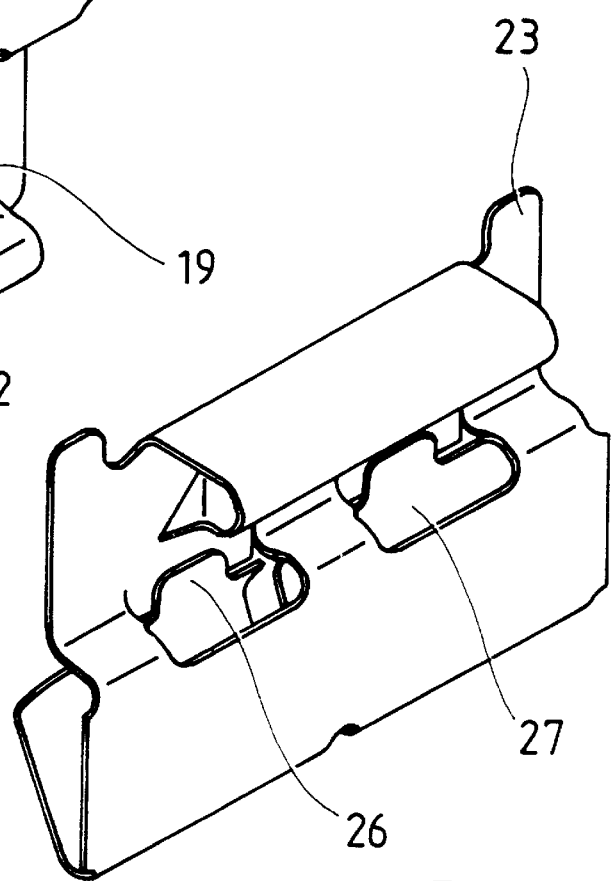
Figure 6:
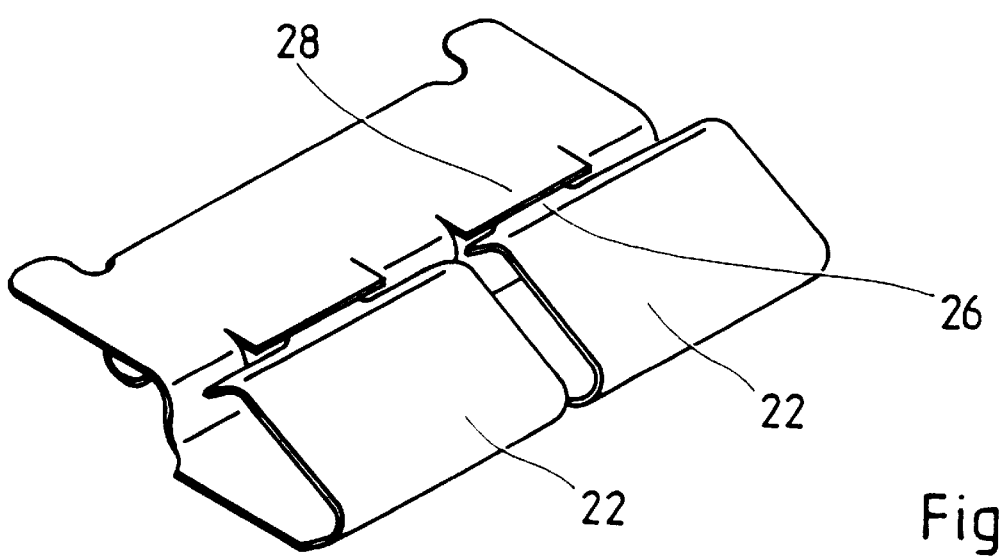

The Contact piece 22 consists of two contact leaves, that stand tight against one another. The contact piece 22, with inserted spring element 2 sticking out over plate one, is of the type that is bent back on itself, that it forms a channel 25 from a tightened oval cross-section (FIG. 3).

Each contact leaf of contact piece 22 carries a somewhat to the outside bent holding tab 26 on its free end, which meshes with a provided transverse opening in base piece 21. On the one longitudinal side of this transverse opening 27 an impact splicing plate 28 is provided, on which the holding tab 26 lies sprung against.

Each contact piece 22, that is to say each of its contact leaves, forms a contact fin 29 to lay on the according contact fin of an equally grooved and spring element equipped, neighboring plate, for example on a side wall.

According to the discovery, plate 1 can form the front plate of an industry standard connective component, which are designed to insert into an electronic enclosure. Inserted in place, this front plate finds itself at the same level as other, likewise with spring and groove equipped, front plates of neighboring connective components. Thereby the respective spring elements and their contact pieces are pressed and sprung against one another making contact.

LIST OF REFERENCE SYMBOLS

1-Plate
2-Spring element
3-Support block
4-Circuit board
5-Circuit board cover
6-Leg
7-Narrow side
8-Narrow side
9-groove
10-Edge
11-Edge
12-Leaf clip
13-Leaf spring
14-U-base
15-U-side angle
16-U-side angle
17-Side wall
18-Side wall
19-Spring claw
20-Corner
21-Base piece
22-Contact piece
23-Impact tab
24-Back
25-Channel
26-Holding tab
27-Transverse opening
28-Impact splicing plate
29-Contact fin

What is claimed is:

1. A prefabricated component for electronic enclosures with a metal plate, and at least one electric contact producing spring element, which is located on the border area of the plate, characterized by the following features:

the plate (1) includes narrow sides (7,8,) and a groove (9) on at least one of its narrow sides (7,8), wherein the groove (9) extends parallel to the edges (10,11) of the narrow sides (7,8), the spring element (2) includes a leaf clip (12) and a leaf spring (13), wherein the leaf clip (12) and the leaf spring (13) are at right angles to one another, the leaf clip (12) engages and is retained in the groove (9), wherein the leaf spring (13) has a level base piece (21) and at least one contact piece (22) bent back on itself, wherein the base piece (21) stands parallel to the narrow side (7,8) and the contact piece (22) extends over the plate.

2. The prefabricated component according to claim 1, wherein the groove (9) includes a right angled section.

3. The prefabricated component according to claim 1, wherein the leaf clip (12) has a u-shaped cross sectional.

4. The prefabricated component according to claim 1, wherein the leaf clip (12) has at least one spring claw (19).

5. The prefabricated component according to claim 4, wherein the spring claw (19) is a bent triangular corner (20) of the leaf clip (12).

6. The prefabricated component according to claim 1, wherein the base pieces (21) of the leaf springs (13) are connected with one another so that together they form a direct spring ribbon.

7. The prefabricated component according to claim 1, wherein on the base piece (21) of the leaf spring (13) at least one impact tab (23), lying at the level of the base piece (21), extends outward.

8. The prefabricated component accordion to claim 1, wherein the contact piece (22) is one of the type that is bent back upon itself, so that it shows in cross section a channel (25) that is brought closer to an oval.

9. The prefabricated component according to claim 8, wherein the contact piece (22) has a holding tab (26) on its free end which is configured to mesh with the transverse opening (27).

10. The prefabricated component according to claim 9, wherein on one longitudinal side of the transverse opening (27), located on the base plate (21), is an impact splicing plate (28) against which the holding tab (26) is sprung.

11. The prefabricated component according to claim 1, wherein on the contact piece (22) is at least one contact fin (29) for installation on a nearby prefabricated component.

12. The prefabricated component according to claim 8, wherein the contact piece (22) includes two contact leaves.

13. The prefabricated component according to claim 1, wherein the plate (1) includes a front plate, for insertion into the electronic enclosure of an electronic device in a planned linked component, which stands in an inserting position at the same level next to a similarly developed front plate of a neighboring linked component, whereby the respective spring elements (2) lie in opposition to one another and their contact pieces (22) are pressed against one another and sprung to make contact.

* * * * *